US 7,969,191 B2

(12) United States Patent
Nedalgi

(10) Patent No.: US 7,969,191 B2
(45) Date of Patent: Jun. 28, 2011

(54) LOW-SWING CMOS INPUT CIRCUIT

(75) Inventor: Dharmaray M Nedalgi, Bangalore (IN)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 12/866,734

(22) PCT Filed: Feb. 2, 2009

(86) PCT No.: PCT/IB2009/050401
§ 371 (c)(1),
(2), (4) Date: Sep. 24, 2010

(87) PCT Pub. No.: WO2009/098626
PCT Pub. Date: Aug. 13, 2009

(65) Prior Publication Data
US 2011/0006810 A1 Jan. 13, 2011

(30) Foreign Application Priority Data

Feb. 6, 2008 (EP) .................................... 08101322

(51) Int. Cl.
*H03K 19/0175* (2006.01)
(52) U.S. Cl. .............................. 326/81; 326/83; 327/333
(58) Field of Classification Search ..................... 326/31, 326/34, 68, 70–72, 76, 80–83, 86–87
See application file for complete search history.

(56) References Cited

U.S. PATENT DOCUMENTS
4,593,212 A 6/1986 Svager
(Continued)

FOREIGN PATENT DOCUMENTS
DE 19719448 A1 11/1998
(Continued)

OTHER PUBLICATIONS
ISA/EPO, International Search Report dated May 4, 2009 for PCT/IB2009/050401.

*Primary Examiner* — Rexford N Barnie
*Assistant Examiner* — Jany Tran
(74) *Attorney, Agent, or Firm* — Jones Day; Brett Lovejoy

(57) ABSTRACT

The invention relates to a CMOS input circuit for receiving low-swing input signals, which is an alternative to the CMOS input circuits as known from the prior art. The CMOS input circuit according to the invention comprises a leveling circuit (LC) that is constructed for arranging, under control of a voltage associated with an output voltage of a CMOS input stage (Inv1), a leveling transistor (M3) which is located in a supply path of the CMOS input stage (Inv1), (i) as a forward-biased diode-connected transistor for regulating the voltage on a source of the CMOS input stage (Inv1) for reducing the gate-source voltage of a switching transistor (M1, M2) in the CMOS input stage (Inv1), when an input voltage of the CMOS input circuit assumes a level associated with a first logical level causing the switching transistor (M1, M2) to be switched off, and (ii) as a conductive path when the input voltage assumes a level associated with a second logical level causing the switching transistor (M1, M2) to be switched on. The invention also relates to an Input-Output circuit, an electronic circuit and a semiconductor device comprising such CMOS input circuit. The invention provides an alternative to known CMOS input circuit that make use of a diode-connected transistor that is short-circuited in case of one of the input voltage levels. An advantageous embodiment of the invention incorporates a positive feedback mechanism that makes the circuit more suitable for low supply voltages.

16 Claims, 5 Drawing Sheets

U.S. PATENT DOCUMENTS

| | | |
|---|---|---|
| 4,825,106 A | 4/1989 | Tipon |
| 5,378,943 A | 1/1995 | Dennard |
| 5,650,742 A * | 7/1997 | Hirano .......................... 327/333 |
| 5,789,942 A | 8/1998 | Mizuno |
| 6,225,838 B1 | 5/2001 | Lee |
| 6,429,683 B1 | 8/2002 | Miller et al. |
| 7,119,578 B2 | 10/2006 | Correale et al. |
| 7,382,159 B1 * | 6/2008 | Baker ............................. 326/83 |
| 7,671,629 B2 * | 3/2010 | Zhang et al. ................... 326/81 |

FOREIGN PATENT DOCUMENTS

| | | |
|---|---|---|
| EP | 0595318 A2 | 5/1994 |

* cited by examiner

PRIOR ART

LOW-SWING CMOS INPUT CIRCUIT

FIELD OF THE INVENTION

The invention relates to CMOS input circuit for receiving low-swing signals, an Input-Output circuit comprising such an input circuit, an electronic circuit comprising such an input circuit, and to a semiconductor device comprising such an input circuit.

BACKGROUND OF THE INVENTION

In conventional CMOS circuits the input signal swing is equal to the supply voltage. With an input signal swing equal to the supply voltage the static current in the CMOS circuit is only attributed to device leakage current as one of the device is always OFF.

There are also situations where analogue signals are received that have a voltage swing less than the supply voltage. As an example, such a signal may be a low-level clock signal which occurs at the low-speed clock input to which a crystal is connected. This low-level clock signal has to be converted into a digital clock signal. In this application the input low-level clock signal has a voltage swing which is less than the supply voltage. This will lead to a static current in the input stage connected to the clock input when the input signal is in a high logic state which has a level lower than the supply voltage (VDD). Then the pull-down transistor (NMOST) is "ON" and pull-up transistor (PMOST) is not completely "OFF". The resulting static current (that runs through both transistors) is detrimental for low power applications. Solutions to this problem, namely to find a receiver circuit which does not suffer from static leakage current in steady state conditions, have been reported in the prior art.

For example, U.S. Pat. No. 6,225,838B1 discloses an integrated circuit buffer including an inverter and a circuit that selectively powers the inverter at a first potential (e.g., VDDL-alpha) when the output of the inverter is at a first logic level (e.g., logic "0"), and at a second higher potential (e.g., VDDL) when the output of the inverter is at a second logic level (e.g., logic "1") opposite the first logic level. The integrated circuit buffer may include an inverter configured as a PMOS pull-up transistor having a gate electrode electrically coupled to an input node and a drain electrode electrically coupled to an output node, and an NMOS pull-down transistor having a gate electrode electrically coupled to the input node and a drain electrode electrically coupled to the output node. A diode and switch are also provided to perform the selective powering operation. The diode is provided to reduce the magnitude of the power supply voltage which the inverter receives when the PMOS pull-up transistor is inactive (thereby reducing the static leakage current) and the switch is provided to bypass the diode when PMOS pull-up transistor is active.

Similar CMOS input circuits have been disclosed in many other documents, e.g. DE19719448, U.S. Pat. No. 5,378,943, EP0595318A2, and U.S. Pat. No. 7,119,578B2. In any case all these documents rely on the short-circuiting of a diode-connected transistor in a supply path under certain states of the output voltage.

In view of the above it may be desired to find an alternative solution.

SUMMARY OF THE INVENTION

It is an object of the invention to provide an alternative low-swing CMOS input circuit.

The invention is defined by the independent claims. The dependent claims define advantageous embodiments.

In a first aspect, the invention relates to a CMOS input circuit comprising:
a power terminal;
a CMOS input stage comprising a switching transistor having a gate for receiving an input voltage, a drain for supplying an output voltage, and a source; wherein a main current path is arranged between the source and the drain of the switching transistor, and
a leveling circuit comprising a leveling transistor having a main current path and a gate electrode, the leveling circuit being arranged for receiving the input voltage and a second voltage associated with the output voltage, the main current path of the leveling transistor being electrically connected between the main current path of the CMOS switching transistor and the power terminal, and wherein the source of the switching transistor is connected to a junction of the main current path of the CMOS switching transistor and the main current path of the leveling transistor, and wherein the leveling circuit is constructed for arranging, under control of the second voltage, the leveling transistor (i) as a forward-biased diode-connected transistor for regulating a voltage on the source for reducing the gate-source voltage of the switching transistor when the input voltage assumes a level associated with a first logical level causing the switching transistor to be switched off, and (ii) as a conductive path when the input voltage assumes a level associated with a second logical level causing the switching transistor to be switched on.

The effect of the features of the CMOS input circuit according to the invention is that, at one of the input levels, instead of short-circuiting (with a further transistor) a diode-connected transistor is used in series with the main current path of the switching transistor. The leveling transistor in the leveling circuit is controlled dependent on the conductive state of the switching transistor. The leveling transistor is arranged as a diode-connected transistor at a first logical level of the input voltage and as a conductive path at a second logical level of the input voltage. The first logical level is a level at which the CMOS input stage would suffer from static leakage current, because the switching element is not completely switched off. For example when the maximum input voltage level is 0.8V (representing a logical "1") and the supply voltage level is 1.2V, then the gate-source voltage of the switching transistor (a PMOS transistor) is still 0.4V. When the threshold voltage of the diode-connected transistor is 0.4V then the gate-source voltage of the switching transistor is effectively reduced by 0.4V which turns the switching transistor off. This gate-source voltage reduction mechanism is used in both the prior art solutions as well as in the invention. However, from the above it is apparent that the manner at which this effect is achieved differs quite significantly. Moreover, the different manner chosen in accordance with the invention also opens up possibilities for further improvements as will become apparent in the description of the advantageous embodiments.

In an embodiment of the CMOS input circuit according to the invention the leveling circuit comprises a first switching element coupled between the drain and the gate electrode of the leveling transistor, and a second switching element coupled between the gate electrode of the leveling transistor and an input for receiving the input voltage, wherein the first switching element is closed and the second switching element is opened when the input voltage assumes the level associated with the first logical level, wherein the first switching element is opened and the second switching element is closed when the input voltage assumes the level associated with the second logical level, wherein the first switching element and the second switching element are controlled by the second voltage. This embodiment provides a convenient manner of arranging the leveling transistor under control of the second voltage. It is preferred that the switching elements are controlled by the second voltage. Proper operation of switching elements requires the use of control voltages that have a decent swing. The second voltage is associated with the output voltage and therefore provides a voltage swing suitable for controlling the switching elements.

In an embodiment of the CMOS input circuit according to the invention the power terminal is a power supply terminal carrying a non-zero power supply voltage, wherein preferably the leveling transistor is a p-type field effect transistor.

In an embodiment of the CMOS input circuit according to the invention the power terminal is a ground terminal, wherein preferably the leveling transistor is an n-type field effect transistor.

In an embodiment of the CMOS input circuit according to the invention the leveling circuit is constructed for arranging of the leveling transistor as a forward-biased diode-connected transistor by electrically connecting the gate electrode to the source of the switching transistor and simultaneously electrically disconnecting the gate electrode from the input of the CMOS input stage, and the arranging of the leveling transistor as a conductive path comprises electrically connecting the gate electrode to the input of the CMOS input stage and simultaneously electrically disconnecting the gate electrode from the source of the switching transistor. The arrangement of the leveling transistor in this embodiment provides for a formation of a forward-biased diode connected transistor in the supply path in case the input voltage assumes a voltage level at which the CMOS input stage would otherwise suffer from a static leakage current, and as a conductive path in the supply path in the case the input voltage assumes another voltage level.

In a further-improved embodiment the leveling circuit comprises a control circuit having a control output for generating a control signal for the leveling transistor, and the control circuit comprises the first switching element being connected between the control output and the drain of the leveling transistor and the second switching element being connected between the control output and the gate of the CMOS input stage, wherein the first switching element and the second switching element are controlled by the second voltage associated with the output voltage. Such an arrangement constitutes an efficient implementation of the desired function.

The implementation in the last mentioned-embodiment is a further simplified in case the control circuit is constructed for both controlling the first switching element and the second switching element by the second voltage, and wherein the switching elements are arranged as MOS transistors of opposite conductivity types. Choosing opposite conductivity types for the switching elements conveniently provides for said simultaneous connection and disconnection of the gate electrode.

A very advantageous embodiment is obtained when in the last-mentioned embodiment the control circuit is constructed for directly controlling the first and the second switching element by the output voltage. The output voltage is a voltage that generally behaves in a more analog way than a further output voltage of a subsequent stage that is connected to the output voltage. Using this analog-type of voltage for controlling the switching elements provides for a positive feedback mechanism in both switching directions of the CMOS input stage, which makes the CMOS input circuit suitable for operation at lower supply voltages than what is possible with the prior art solutions. The positive feedback mechanism will be explained in more detail in the detailed description.

It will be apparent from the above described embodiments that the invention may be applied in the supply path at a side of the power supply terminal or at a side of the ground terminal side. However, the invention may be advantageously provide at both sides, which renders the CMOS input circuit suitable for reducing the static leakage current when the input voltage swing is such that neither the supply voltage nor the ground level is reached. In an embodiment incorporating this combination the CMOS input stage further comprises a second switching transistor having a gate for receiving the input voltage, a drain for supplying the output voltage, and a source, wherein a main current path of the second switching transistor is arranged between the source and the drain of the second switching transistor and in series with the main current path of the switching transistor, and the CMOS input circuit further comprises:

a second power terminal, and a second leveling circuit comprising a second leveling transistor having a second main current path and a second gate electrode, the second leveling circuit being arranged for receiving the input voltage and a third voltage associated with the output voltage, the second main current path of the second leveling transistor being electrically connected between the main current path of the second switching transistor and the second power terminal, and wherein the source of the second switching transistor is connected to a junction of the main current path of the second switching transistor and the second main current path, and wherein the second leveling circuit is constructed for arranging, under control of the third voltage, the second leveling transistor (i) as a forward-biased diode-connected transistor for regulating a voltage on the source of the second switching transistor for reducing the gate-source voltage of the second switching transistor when the input voltage assumes a level associated with the second logical level causing the second switching transistor to be switched off, and (ii) as a conductive path when the input voltage assumes a level associated with the first logical level causing the second switching transistor to be switched on.

In this embodiment when the input voltage is low (but higher than ground level) the voltage on, for example, the voltage on the source of the switching transistor (may also be called virtual supply node) is equal to the supply voltage and voltage on the source of the second switching transistor (may also be called virtual ground node) is increased to one diode voltage above ground level, and when the input voltage is "high" (but lower than the supply voltage) the voltage on the virtual supply node is decreased to one diode voltage below the supply voltage and the voltage on virtual ground node is equal to ground level.

It must be noted that for the embodiments having the second leveling circuit the same variations and embodiments are possible as for the embodiments having the first leveling circuit. The earlier mentioned embodiments apply mutatis mutandis.

Also, the invention may be advantageously applied twice (or any other positive number) on a same side of the power terminal, which provides for a larger tolerance against a low swing input voltage, because in that case two diode voltage drops are created in case of one of the input voltage levels. In an embodiment incorporating this combination the CMOS input circuit further comprises:

a further leveling circuit comprising a further leveling transistor having a further main current path and a further gate electrode, the further leveling circuit being arranged for receiving the input voltage and a further voltage associated with the output voltage, the further main current path of the further leveling transistor being connected in between the main current path of the leveling transistor and the power terminal, and an internal node connected to the junction between the main current path of the leveling transistor and the further main current path of the further leveling transistor, and wherein the further leveling circuit is constructed for arranging, under control of the third voltage, the further leveling transistor (i) as a forward-biased diode-connected transistor for regulating a voltage on the internal node, and thereby indirectly regulating the voltage on the source of the first switching transistor for reducing the gate-source voltage of the switching transistor when the input voltage assumes a level associated with the first logical level causing the switching transistor to be switched off, and (ii) as a conductive path when the input voltage assumes a level associated with the second logical level causing the switching transistor to be switched on.

When the invention is applied only on a side of the power supply terminal, when the input voltage is low (e.g. ground level) the voltage on, the virtual supply node is equal to the supply voltage, and when the input voltage is "high" (but lower than the supply voltage) the voltage on the virtual supply node is decreased to two diode voltages below supply level.

Likewise, when the invention is applied only on a side of the ground terminal when the input voltage is "high" (e.g. supply level) the voltage on the virtual ground node is equal to the ground voltage, and when the input voltage is low (but higher than ground level) the voltage on the virtual ground node is increased to two diode voltages above ground level.

It must be noted that for the embodiments having the further leveling circuit the same variations and embodiments are possible as for the embodiments having the first leveling circuit. The earlier mentioned embodiments apply mutatis mutandis.

In an embodiment of the CMOS input circuit the CMOS input stage is selected from a group comprising: an inverter, a buffer, and a logic gate.

In a second aspect the invention relates to Input-Output circuit comprising the CMOS input circuit according to the invention.

In a third aspect the invention relates to an electronic circuit comprising the CMOS input circuit according to the invention.

In a fourth aspect the invention relates to a semiconductor device comprising the circuit according to the invention.

These and other aspects of the invention are apparent from and will be elucidated with reference to the embodiments described hereinafter.

DETAILED DESCRIPTION OF THE PREFERRED EMBODIMENT

In conventional CMOS circuits the levels of the input signal are equal to the levels of the supply voltages. With an input signal swing between the supply voltage levels, the static current in the CMOS circuit is attributed to device leakage current only, as one of the devices is always OFF.

There are also situations where analogue signals are received that have a voltage swing less than the supply voltage. As an example, such a signal may be a low-level clock signal which occurs at the low-speed clock input to which a crystal is connected. This low-level clock signal has to be converted into a digital clock signal. In this application the input low-level clock signal has a voltage swing which is less than the supply voltage. This may lead to a static current when the input signal is in a "high" logic state which is less than the supply voltage.

Wherever in this description the phrase "power terminal" is used, this is defined as being one of power supply terminals carrying a non-zero power supply voltage or the ground voltage. Wherever in this description the phrase "current path" is used, this is defined as the electrical path form a first power supply terminal (e.g. VDD) to a second power supply terminal (e.g. VSS or GND) that goes through the main current path of at least one transistor, wherein the main current path in a transistor is defined as from source/drain through the channel to drain/source.

Figure 1:
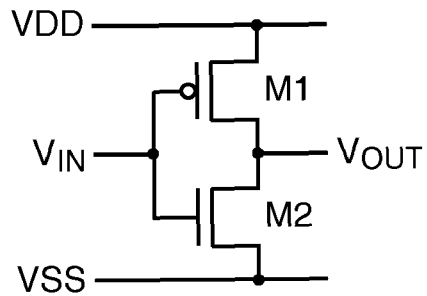
FIG. 1 shows a CMOS input buffer as known from the prior art.

FIG. 1 shows a conventional CMOS inverter as input stage. This inverter comprises a PMOS pull-up transistor M1 in series with a NMOS pull-down transistor M2. The series arranged main current paths of the transistors M1, M2 are connected between a power supply terminal VDD (e.g. at 1.2V) and a ground terminal VSS (e.g. at 0V). The gates of both transistors M1, M2 are directly controlled by an input voltage Vin and an output is defined by the connection of the drains of the transistors M1, M2. When Vin is equal to the supply voltage, the pull-up transistor M1 is completely "OFF" and cuts the path from the power supply terminal VDD to the ground terminal VSS. Similarly when Vin is equal to ground level then the pull-down transistor M2 is completely "OFF" and cuts the path from the power supply terminal VDD to the ground terminal VSS.

When the input signal Vin is "high" (but less than VDD) the pull-down transistor M2 (NMOST) is switched "ON" and pull-up transistor M2 (PMOST) is not completely switched "OFF", which leads to a static current through both transistors M1, M2 which is not desired in low power applications. Solutions to this problem, namely to find a receiver circuit which does not suffer from static leakage current in steady state conditions, have been reported in the prior art.

Figure 2:
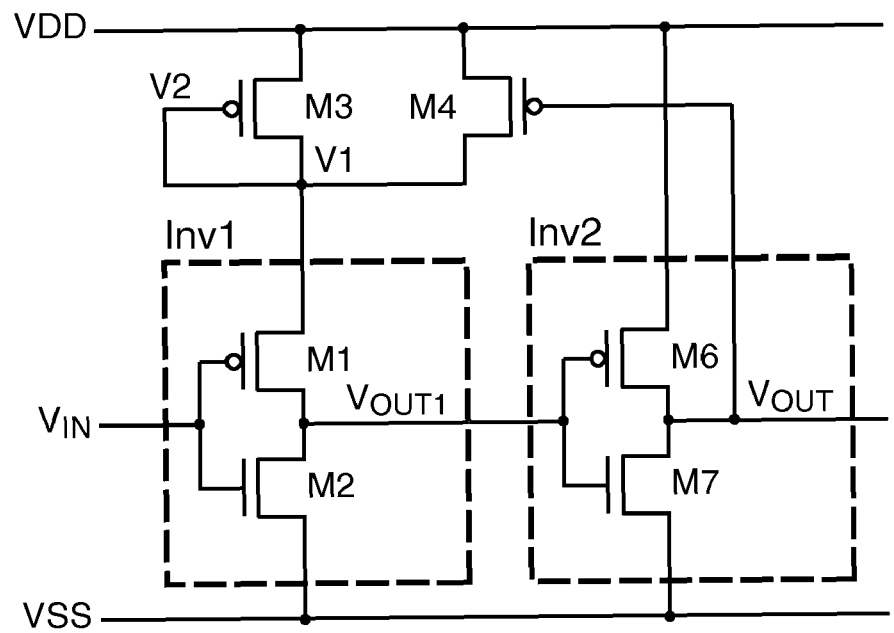
FIG. 2 shows a low-swing CMOS input buffer comprising a diode-connected transistor arrangement as known from the prior art.

FIG. 2 shows a solution to the above-described static leakage current problem as reported in the prior art. In FIG. 2 the output of a first inverter Inv1 (similar to FIG. 1) is connected to the input of a second inverter Inv2 comprising pull-up transistor M6 (PMOST) and pull-down transistor M7 (NMOST) which generates a further output voltage Vout. The first inverter Inv1 is provided with a diode-connected PMOS transistor M3 in its supply path, which is connected in parallel with a short-circuiting transistor PMOS M4 that is controlled by the output of the second inverter Inv2. The short-circuiting PMOS transistor M4 acts as a switch to enable the earlier described selective powering operation.

The diode-connected PMOS transistor M3 is provided to reduce the magnitude of the power supply voltage supplied to the first inverter Inv1 when the PMOS pull-up transistor M1 is inactive (which reduces the gate-source voltage of the PMOS pull-up transistor M1 and thereby reduces the static leakage current) and the switch M4 is provided to bypass the diode-connected PMOS transistor M3 when PMOS pull-up transistor M1 is active.

The solution as illustrated in FIG. 2 will only work as long as the supply voltage is high enough. In state-of-the art CMOS process technologies, the circuit of FIG. 2 fails to operate properly when the supply voltage is lower than about 1.2V; a voltage which is generally used in such technologies, but often the supply voltage is even less. The low-voltage operation failure can be understood as follows.

When the swing of the input voltage Vin is lower than the supply voltage VDD, for example between 0V and 0.8V, then the switching levels of the first inverter Inv1 may be 0.6V (=$V_{IH}$) and 0.4V (=$V_{IL}$) respectively. This means that when the input voltage Vin is 0.6V or higher, the buffer circuit should produce a high output voltage; the output voltage Vout1 of the first inverter Inv1 should be 0V and the output voltage Vout of the second inverter Inv2 should be equal to the supply voltage (VDD). Similarly, when the input voltage Vin is 0.4V or lower, the buffer circuit should produce a low output voltage; the output voltage Vout1 of the first inverter Inv1 should be equal to the supply voltage and the output voltage Vout of the second inverter Inv2 should be 0V.

When the diode-connected transistor M3 is not short-circuited (output voltage Vout is "high" and short-circuiting transistor M4 is "OFF"), the voltage on internal node V1 will be a diode drop below the supply voltage (VDD) which will be close to 0.8V (wherein the diode drop is equal to the threshold voltage of the transistor which is assumed to be 0.4V for all transistors in this example). When the input voltage Vin is going low, at an input voltage Vin of 0.4V, both the pull-up transistor M1 and the pull-down transistor M2 will have a similar gate-source voltage of about 0.4V. A consequence of that is that the pull-up transistor M1 may not be able to override pull-down transistor M2 and Vout1 will not rise to a level above the threshold voltage of pull-down transistor M7 of the second inverter Inv2 (which is generally equal to half the supply voltage VDD/2=0.6V). In other words, the circuit fails to detect a low input voltage Vin on the input. It must be noted that short-circuiting transistor M4 remains "OFF" in this entire process.

For the opposite switching direction a similar problem exists. When the input voltage Vin is "low", then the output voltage Vout1 of the first inverter Inv1 and the internal node voltage V1 will be VDD (through short-circuiting transistor M4) and the output voltage Vout of the second inverter will be 0V. The rising input voltage Vin at 0.6V need to be detected as "high", but at this voltage level, both pull-up transistor M1 and pull-down transistor M2 will have a similar gate-source voltage of about 0.6V. A consequence of this is that pull-down transistor M2 may not be able to over ride pull-up transistor M1 and consequently the output voltage Vout1 of the first inverter Inv1 may not fall below a level lower than the threshold voltage of the second inverter Inv2. The circuit fails to detect the "high" of the input voltage Vin. It must be noted that short-circuiting transistor M4 remains "ON" in this entire process and diode drop does not come into effect.

In one of the advantageous embodiments described later in this description the above problem is solved.

Figure 3:
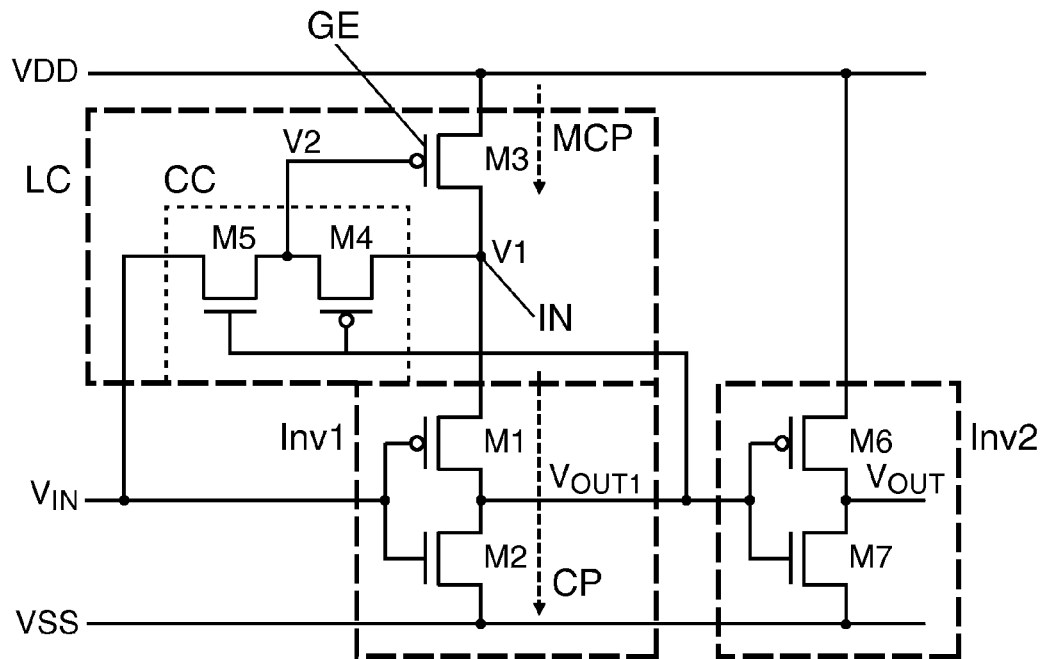
FIG. 3 shows a low-swing CMOS input buffer according to a first embodiment of the invention.

Referring to FIG. 3 which discloses a low-swing CMOS input buffer according to a first embodiment of the invention. This embodiment will be discussed in as far as it differs from FIG. 2. The parallel arrangement of the diode-connected transistor M3 (FIG. 2) and the short-circuiting transistor M4 (FIG. 2) have been replaced with a leveling circuit LC. The leveling circuit LC comprises a leveling transistor M3, in this example a PMOS transistor. The leveling transistor M3 comprises a main current path MCP and a gate electrode GE which controls the current through the main current path MCP. The main current path MCP is connected in series with a main current path CP defined through the inverter input stage Inv1. A PMOS transistor M4 is connected between the gate electrode GE and an internal node IN which is defined as the connection between the leveling transistor M3 and the pull-up transistor M1 of the inverter input stage Inv1. An NMOS transistor M5 is connected between the gate electrode GE and the input carrying the input voltage Vin. Both the PMOS transistor M4 and the NMOS transistor M5 are controlled by the output voltage Vout1 of the inverter input stage Inv1. The PMOS transistor M4 and the NMOS transistor M5 together form a so-called control circuit CC. In an alternative embodiment, both transistors M4, M5 may be controlled by the output voltage Vout of the second inverter stage Inv2, but then the conductivity types of both transistors have to be reversed. As far as the steady-state DC levels are concerned both embodiments behave similar as will be apparent to a person skilled in the art. However, the embodiment as illustrated in FIG. 3 benefits from an advantageous positive-feedback effect as will be elaborated on later in this description.

The CMOS input buffer of FIG. 3 behaves as illustrated in the next two paragraphs.

When the input voltage Vin is "low" (e.g. equal to ground voltage VSS) this circuit behaves similar to that of a normal buffer without the leveling circuit LC. With input voltage at "low" the pull-down transistor M2 is "OFF" and the pull-up transistor M1 is "ON" which makes the output voltage Vout1 of the first inverter stage Inv1 equal to the voltage V1 on the internal node IN. When the output voltage Vout1 rises to the voltage V1 on the internal node IN it turns "OFF" PMOS transistor M4 while it turns "ON" NMOS transistor M5. By doing so, the gate electrode GE is effectively disconnected from the internal node IN and connected to the input voltage Vin through NMOS transistor M5 which turns "ON" leveling transistor M3 completely. The leveling transistor M3 then connects the internal node to the power supply voltage VDD. Summarizing, when the input voltage Vin is "low" then Vout1=V1="high"=VDD and V2=Vin="low"=VSS.

When the input voltage Vin is "high" (but lower than VDD) the supply voltage available to inverter circuit is reduced by one threshold voltage (in order to bring it closer to the input voltage Vin) so that pull-up transistor M1 is turned (more) "OFF" to reduce static current through the main current path CP. With the input voltage "high" (but lower than VDD) the pull-down transistor M2 is turned "ON", which reduces the output voltage Vout1 of the first inverter stage Inv1 to ground level VSS. With the output voltage Vout1 of the first inverter stage Inv1 "low" the NMOS transistor M5 is "OFF" and the PMOS transistor M4 is "ON" which connects the internal node IN to the gate electrode GE through the PMOS transistor and disconnects the gate electrode GE from the input voltage Vin. In this situation the leveling transistor M3 becomes, so called, diode-connected (drain and gate are shorted). This diode-connected transistor M3 reduces the supply voltage available to the inverter stage Inv1 with one diode drop, wherein the diode drop is equal to the threshold voltage of the leveling transistor M3. The voltage V1 on the internal node IN now becomes VDD-VD (with VD equal to the threshold voltage of the transistor). This reduction in the supply voltage available to the inverter input stage Inv1 eliminates/minimizes the static current through the main current path CP, because it reduces the gate-source voltage of the pull-up transistor M1.

In the above description and throughout other parts of the description the words "connecting" and "disconnecting" are used. The word "connecting" is meant to comprise also the situation where the resistance between two nodes is (gradually) reduced (or the conductance is increased) from a large value (representing an "open") to a small value (representing a "short"). The word "disconnecting" is meant to comprise also the situation where the resistance between two nodes is (gradually) increased (or the conductance is decreased) from a small value (representing a "short") to a large value (representing an "open").

Figure 6:
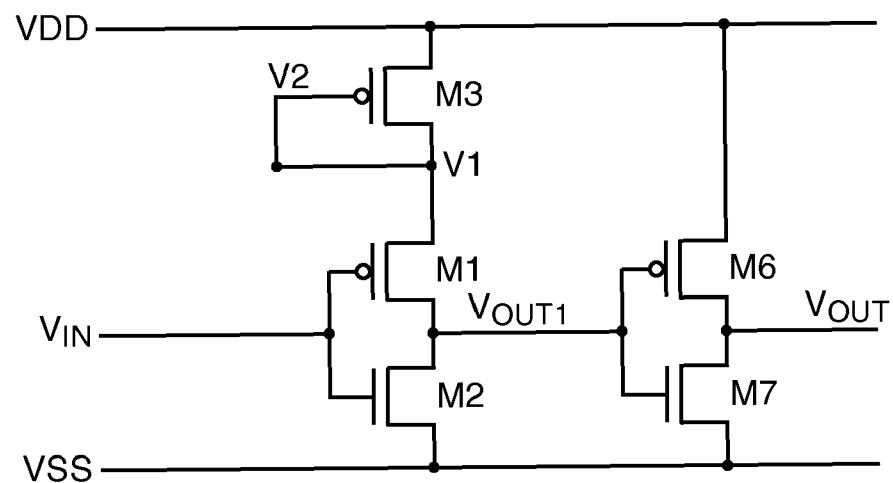
FIG. 6 shows a schematical view of the low-swing CMOS input buffer of FIG. 3 in a second of the input stages.

Referring back to the earlier described problem of FIG. 2 wherein level detection of the input voltage Vin may fail during certain conditions. It is now assumed that the same signaling conditions apply, namely VDD=1.2, $V_{IH}$=0.6V, $V_{IL}$=0.4V, $V_{TH}$=0.4V (threshold voltage) and a swing of the input voltage Vin of 0V to 0.8V. When the input voltage is "high" (0.8V), Vout1 is "low" (0V); at this time NMOS transistor M5 is completely "OFF" and the gate electrode GE and the internal node IN are connected through conducting PMOS transistor M4, which makes leveling transistor M3 diode-connected as illustrated in FIG. 6 and V1=V2=VDD−VT=0.8V (assuming a threshold voltage ($V_{TH}$) of 0.4V). The pull-up transistor M1 is "OFF" and the static current in the circuit is reduced, because of the lower gate-source voltage in this transistor.

When the input voltage Vin is going "low", at an input voltage $V_{IN}$ of 0.4V both transistors M1, M2 in the inverter input stage Inv1 will have a similar gate-source voltage of about 0.4V. In that case pull-up transistor M1 may not be able to over ride pull-down transistor M2 and the output voltage Vout1 of the first inverter stage Inv1 will not rise to a level above the threshold voltage of the second inverter stage Inv2.

Figure 5:
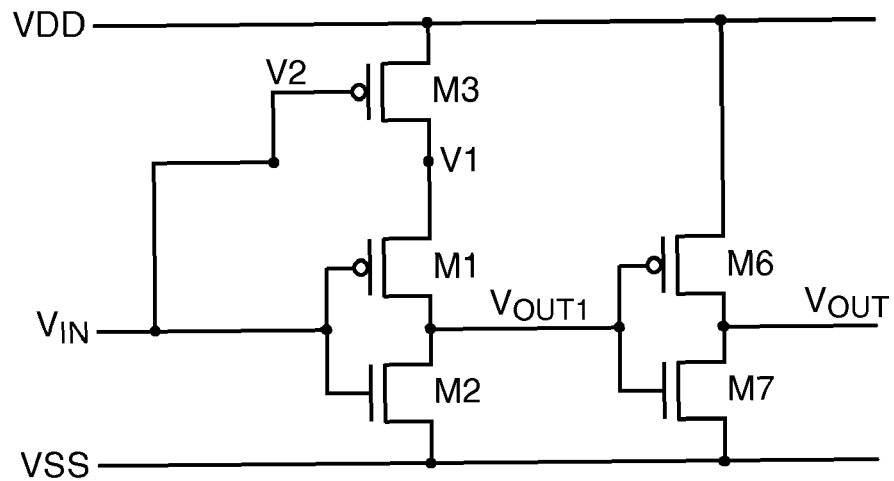
FIG. 5 shows a schematical view of the low-swing CMOS input buffer of FIG. 3 in a first one of the input states.

However, the output voltage Vout1 of the first inverter stage Inv1 will rise above VSS-level (0V)! In this embodiment, this small increase is used as a feedback voltage to reduce the gate-source voltage of the PMOS transistor M4 and simultaneously increase the gate-source voltage of the NMOS transistor M5. This makes the PMOS transistor M4 more resistive and the gate electrode GE more decoupled from the internal node IN, and simultaneously more coupled to the input voltage Vin. This will reduce the voltage V2 of the gate electrode GE and thus increases the gate-source voltage of the leveling transistor M3, which then supplies more current and increases the voltage V1 at the internal node IN. This increase of the internal node voltage V1 will further increase the output voltage Vout1, which then further increases the above-described coupling and decoupling of the gate electrode GE. The internal node voltage V1 clearly increases further by this feedback mechanism. This process continues until the initially diode-connected leveling transistor M3 is fully turned "ON" as illustrated in FIG. 5.

The here described feedback mechanism makes the circuit suitable for detecting a low input voltage even at low supply voltages. It must be noted that the feedback mechanism may not work satisfactorily if the PMOS transistor M4 and the NMOS transistor M4 are controlled by the output voltage Vout of the second inverter stage Inv2. The reason behind this is that this output voltage behaves more "digitally" then the output voltage of the first inverter stage Inv1. So, for a feedback mechanism to occur the connecting/disconnecting of the gate-electrode with the internal node IN and the input must be controlled directly by the output of the first input stage (which may be an inverter as here described, but other circuits like logic gates is also possible).

Figure 4:
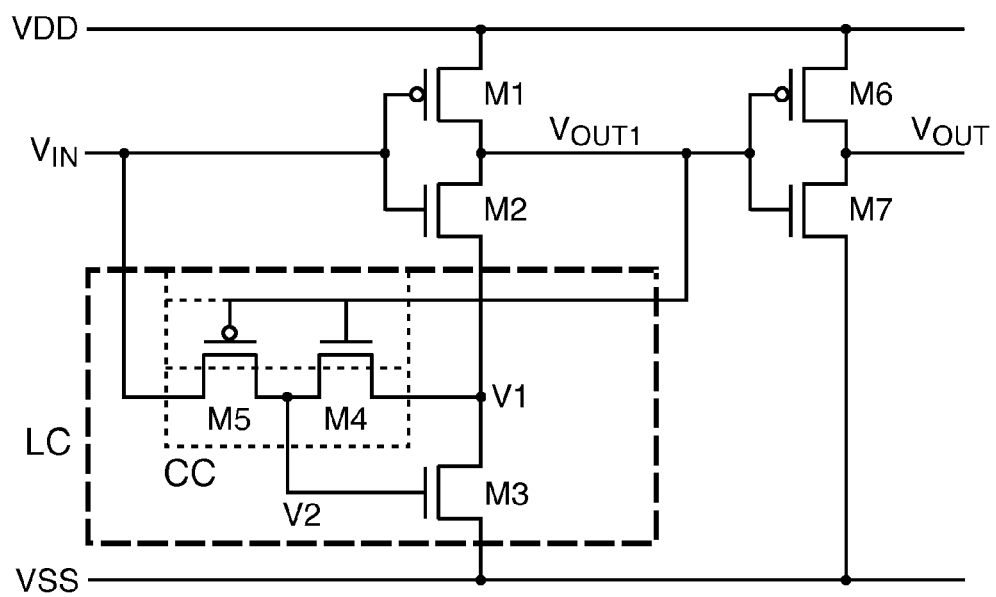
FIG. 4 shows a low-swing CMOS input buffer according to a second embodiment of the invention.

When reading this description a person skilled in the art will easily come up with different embodiments of the invention. For example, in case the swing of the input voltage is not from 0 to 0.8V, but from 0.4V to 1.2V for example, there is a need to apply the invention in a ground path of the inverter input stage Inv1. FIG. 4 discloses such a low-swing CMOS input buffer according to a second embodiment of the invention. Apart from connecting the leveling circuit LC on the other side of the inverter stage (the NMOS-side or ground-side) also the conductivity types of the transistors are reversed. This is not mandatory but makes the implementation very straightforward. The person skilled in the art knows that PMOS transistors may be replaced by NMOS transistors if the gate voltage is inversed. The circuit in FIG. 4 operates analogously as to the circuit in FIG. 3 although the voltage levels in the description have to be inverted.

It is also possible to connect two leveling circuits with their main current paths in series on one side of the inverter stage Inv1 which provides for a stronger supply voltage reduction (two threshold voltages) in one of the input voltage levels. Each leveling circuit LC then comprises its own connection circuit.

Figure 7:
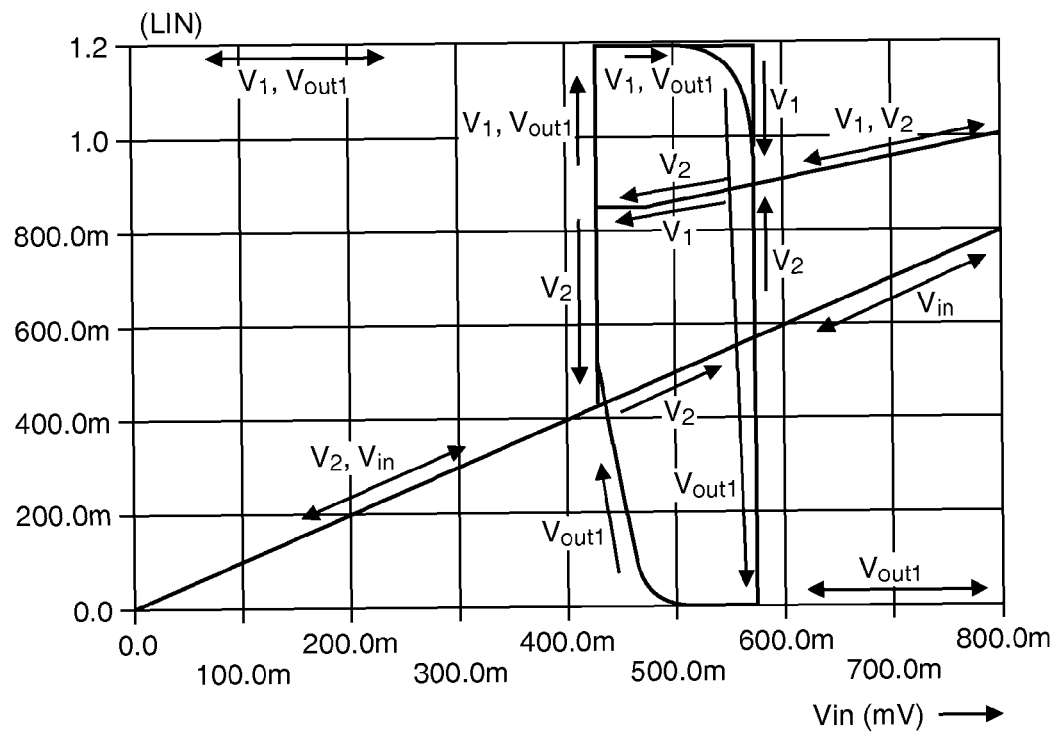
FIG. 7 shows a graphical output of a DC-analysis of the low-swing CMOS input buffer of FIG. 3.
Figure 8:
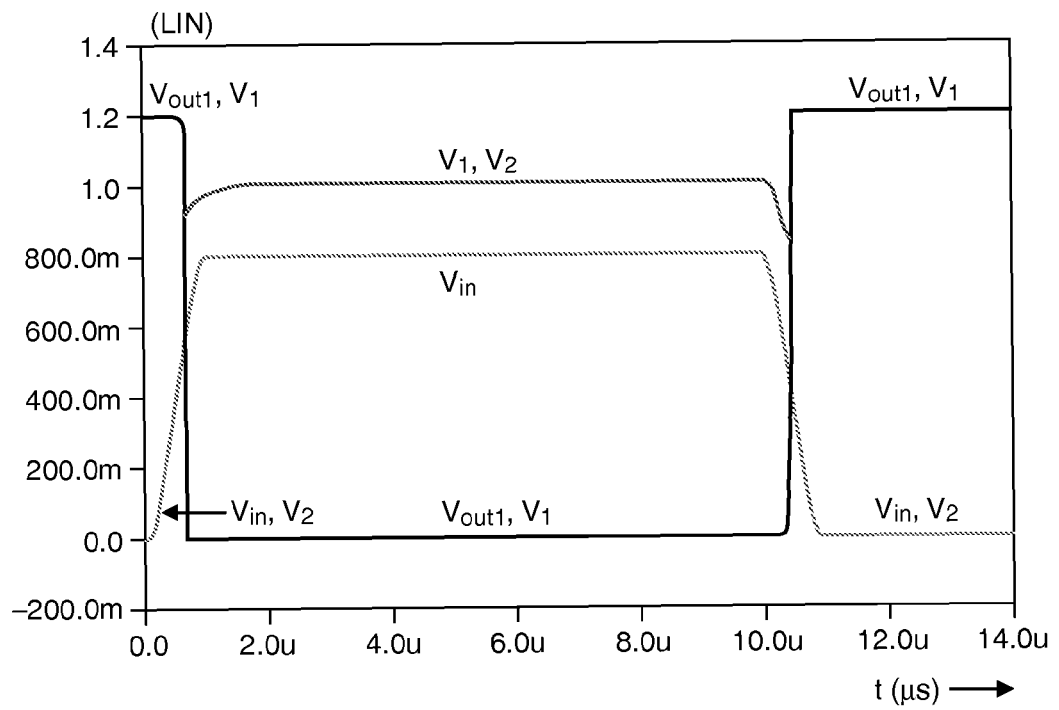
FIG. 8 shows a graphical output of a transient analysis of the low-swing CMOS input buffer of FIG. 3.

The CMOS input circuit according to the invention also has been simulated. FIG. 7 shows a graphical output of a DC-analysis of the low-swing CMOS input buffer of FIG. 3 and FIG. 8 shows a graphical output of a transient analysis of the same CMOS input buffer. For the simulations a power supply voltage of 1.2V is taken. The input signal swing is 0 to 0.8V.

Referring to FIG. 7, when the input voltage Vin is rising from 0V up to +−550 mV (which is $V_{IH}$ of the circuit) the internal node voltage V1 is about equal to the output voltage Vout1 of the inverter input stage Inv1. The gate electrode voltage (GE) is connected to the input, so the gate electrode voltage V2 follows the input voltage Vin during this transition. In this transition the leveling transistor M3 behaves like a cascoded PMOS transistor that is controlled by the input voltage Vin. When the input voltage Vin rises further to above 550 mV the output voltage Vout1 of the first inverter stage decreases rapidly to 0V and remains 0V until Vin=800 mV. At the same time both the gate electrode voltage V2 and the internal node voltage V1 assume a level equal to the supply voltage minus the earlier described diode drop of the then diode-connected leveling transistor M3 which is less than 400 mV in these simulations. It must be noted that the diode drop depends on the current through the transistor. Initially, there is more current and thus a larger voltage drop. Then, as the current reduces the voltage drop also reduces.

When the input voltage Vin is falling from 800 mV to 0V initially the same curve is follow, however the internal node voltage V1 and the gate electrode voltage V2 go back to their low-input voltage values (VDD and Vin respectively) at about 430 mV (which is $V_{IL}$ of the circuit). Also the output voltage Vout1 of the first inverter stage Inv1 does not go back towards its original value (VDD) before this input voltage of about 430 mV. In other words both voltages follow the supply voltage minus the diode drop for a larger range of the input voltage Vin. FIG. 7 clearly illustrates a hysteresis effect which is beneficial for the noise margins of the circuit.

FIG. 8 illustrates the transient analysis results (voltage versus time t (in µs)) from which it is also clear that the internal node voltage V1 and the gate electrode voltage V2 assumes level equal to the supply voltage minus a diode drop in case the input voltage Vin is 800 mV.

Figure 9:
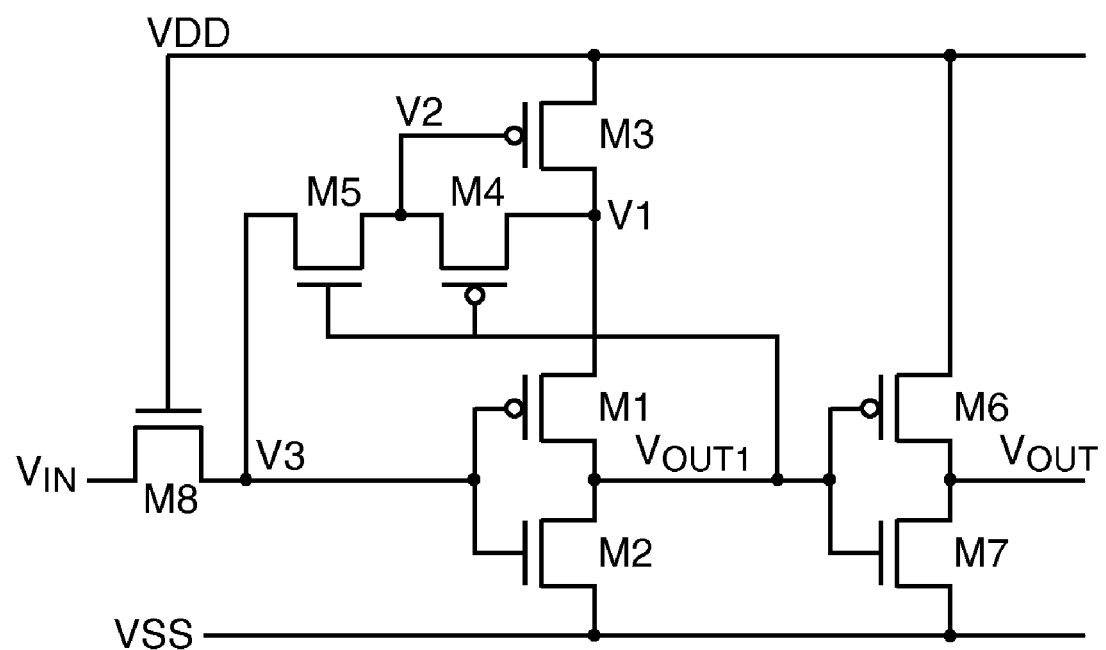
FIG. 9 shows a low-swing input receiver according to a third embodiment of the invention having a high-voltage input protection.

The CMOS input circuit according to the invention as described above works satisfactorily as long as the input voltage swing is more than the transition voltage ($V_{IH}$) of the buffer and as long as it is less than the device stress limit (the maximum allowable gate-oxide voltage). If the voltage swing is more than the device stress limit then an additional NMOST M8 may be added as illustrated in FIG. 9. The additional NMOST M8 has a gate that is connected to the power supply VDD. The additional pass transistor M8 prevents the input voltage Vin to be transferred to the input V3 of the inverter stage in case the input voltage Vin exceeds a level equal to the supply voltage minus the threshold voltage of the additional transistor M8.

The invention thus provides, in a first aspect, a CMOS input circuit for receiving low-swing input signals, which is an alternative to the CMOS input circuits as known from the prior art. The CMOS input circuit according to the invention comprises a leveling circuit that is arranged for arranging a leveling transistor, which is located in a supply path of a CMOS input stage, as a forward-biased diode-connected transistor for regulating the voltage on the internal node to reduce a static leakage current in the CMOS input stage by reducing the gate-source voltage of a switching transistor, located in a current path of the CMOS input stage, when an input voltage of the CMOS input circuit assumes a level associated with a first logical level, and as a conductive path when the input voltage assumes a level associated with a second logical level.

The invention provides an alternative to known CMOS input circuit that make use of a diode-connected transistor that is short-circuited in case of one of the input voltage levels. An advantageous embodiment of the invention incorporates a positive feedback mechanism that makes the circuit more suitable for low supply voltages.

The features of the CMOS input circuit in accordance with the invention are:

Providing interface to low-swing input signals;

Effectively reducing static leakage current;

May be implemented in baselines CMOS process technology without requiring specific process options (may be implemented using only three additional transistors), which keeps the manufacturing costs under control;

Simple to design and implement (may be implemented using only three additional transistors);

Features built-in hysteresis, which is advantageous for the noise margins of the circuit, and Can be easily adapted for protection against high voltages on the input (a simple pass-gate on the input having its gate connected to a respective power terminal).

The invention may be applied in many different applications where there is a need for receiving low swing input with high voltage tolerance functionality. One of the most important applications identified so far is the input buffer of an Input-Output circuit. However, the circuit topology may be used in any circuit requiring interoperability of two different voltages. This invention is also useful for future processes where transistors supply voltages will be scaled down. Since interfacing requirements with different voltage devices will always be there, this topology will be very useful for upcoming processes.

Various variations of the CMOS input circuit, IO-circuit, electronic circuit, and semiconductor device in accordance with the invention are possible and do not depart from the scope of the invention as claimed.

All embodiments were discussed in the light of an inverting CMOS buffer. However, the invention is applicable without any modification in case of other CMOS input stages like non-inverting buffers or logic gates (like 2-input NAND, 2-input NOR, etc). The invention is applicable if there is a current path in the input stage that is controlled by the input-voltage of the CMOS input circuit, wherein there is a switching transistor (either of the pull-up type or the pull-down type) that is not fully switched off in one of the input voltage levels.

The invention claimed is:

1. A CMOS input circuit comprising:
   a first power terminal (VDD, VSS);
   CMOS input stage (Inv1) comprising a first switching transistor (M1, M2), the first switching transistor (M1, M2) comprising:
      a first gate for receiving an input voltage (Vin),
      a first drain for supplying an output voltage (Vout1), and
      a first source, wherein a first main current path (CP) is arranged between the first source and the first drain; and
   a leveling circuit (LC) comprising a leveling transistor (M3) having a leveling circuit main current path (MCP) and a gate electrode (GE), the leveling circuit (LC) being arranged for receiving the input voltage (Vin) and a second voltage associated with the output voltage (Vout1), the leveling circuit main current path (MCP) of the leveling transistor (M3) being electrically connected between the first main current path (CP) of the first switching transistor (M1, M2) and the first power terminal (VDD, VSS), and wherein
   the first source is connected to a junction of the first main current path (CP) of the first switching transistor (M1, M2) and the leveling circuit main current path (MCP) of the leveling transistor (M3), and
   the leveling circuit (LC) is constructed for arranging, under control of the second voltage, the leveling transistor (M3)
      (i) as a forward-biased diode-connected transistor for regulating a voltage (V1) on the first source, for reducing a gate-source voltage of the first switching transistor (M1, M2) when the input voltage (Vin) assumes a level associated with a first logical level causing the first switching transistor (M1, M2) to be switched off, and
      (ii) as a conductive path when the input voltage (Vin) assumes a level associated with a second logical level causing the first switching transistor (M1, M2) to be switched on.

2. The CMOS input circuit of claim 1, wherein the leveling circuit (LC) comprises:
   a first switching element (M4) coupled between a drain and the gate electrode (GE) of the leveling transistor (M3), and
   a second switching element (M5) coupled between the gate electrode (GE) of the leveling transistor (M3) and an input for receiving the input voltage (Vin),
   and wherein
   the first switching element (M4) is closed and the second switching element (M5) is opened when the input voltage (Vin) assumes the level associated with the first logical level, and
   the first switching element (M4) is opened and the second switching element (M5) is closed when the input voltage (Vin) assumes the level associated with the second logical level, and wherein
the first switching element (M4) and the second switching element (M5) are controlled by the second voltage.

3. The CMOS input circuit of claim 1, wherein the first power terminal is a power supply terminal (VDD) carrying a non-zero power supply voltage.

4. The CMOS input circuit of claim 1, wherein the leveling transistor (M3) is a p-type field effect transistor.

5. The CMOS input circuit of claim 1, wherein the first power terminal is a ground terminal (VSS).

6. The CMOS input circuit of claim 1, wherein the leveling transistor (M3) is an n-type field effect transistor.

7. The CMOS input circuit of claim 1, wherein
the leveling transistor (M3) is configurable as a forward-biased diode-connected transistor by electrically connecting the gate electrode (GE) to the first source and simultaneously electrically disconnecting the gate electrode (GE) from an input of the CMOS input stage (Inv1), and
the leveling transistor (M3) is configurable as a conductive path by electrically connecting the gate electrode (GE) to the input of the CMOS input stage (Inv1) and simultaneously electrically disconnecting the gate electrode (GE) from the first source.

8. The CMOS input circuit of claim 2, wherein
the leveling circuit (LC) comprises a control circuit (CC) having a control output for generating a control signal (V2) for the leveling transistor (M3), wherein the control circuit (CC) comprises:
the first switching element (M4) being connected between the control output and the drain of the leveling transistor (M3), and
the second switching element (M5) being connected between the control output and the first gate, wherein
the first switching element (M4) and the second switching element (M5) are controlled by the second voltage associated with the output voltage (Vout1).

9. The CMOS input circuit of claim 8, wherein the control circuit (CC) is constructed for both controlling the first switching element (M4) and the second switching element (M5) by the second voltage, and wherein the first switching element (M4) and the second switching element (M5) are arranged as MOS transistors of opposite conductivity types.

10. The CMOS input circuit of claim 9, wherein the control circuit is constructed for directly controlling the first and the second switching element (M4, M5) by the output voltage (Vout1).

11. The CMOS input circuit of claim 1, wherein
the CMOS input stage (Inv1) further comprises a second switching transistor (M2, M1), the second switching transistor (M2, M1) comprising:
a second gate for receiving the input voltage (Vin),
a second drain for supplying the output voltage (Vout1), and
a second source, wherein a second main current path of the second switching transistor (M2, M1) is arranged between the second source and the second drain and in series with the first main current path,
the CMOS input circuit further comprising:
a second power terminal (VSS, VDD), and
a second leveling circuit comprising a second leveling transistor having a second main current path and a second gate electrode, the second leveling circuit being arranged for receiving the input voltage (Vin) and a third voltage associated with the output voltage (Vout1), the second main current path being electrically connected between the second main current path (CP) of the second switching transistor (M2, M1) and the second power terminal (VSS, VDD), and wherein the second source is connected to a junction of the second main current path and the second main current path, and wherein
the second leveling circuit is constructed for arranging, under control of the third voltage, the second leveling transistor
(i) as a forward-biased diode-connected transistor for regulating a voltage on the second source for reducing a gate source voltage of the second switching transistor (M2, M1) when the input voltage (Vin) assumes a level associated with the second logical level causing the second switching transistor (M2, M1) to be switched off, and
(ii) as a conductive path when the input voltage (Vin) assumes a level associated with the first logical level causing the second switching transistor (M2, M1) to be switched on.

12. The CMOS input circuit of claim 1, the CMOS input circuit further comprising:
a further leveling circuit comprising a further leveling transistor having a further main current path and a further gate electrode, the further leveling circuit being arranged for receiving the input voltage (Vin) and a further voltage associated with the output voltage (Vout1), the further main current path of the further leveling transistor being connected in between the leveling circuit main current path (MCP) of the leveling transistor (LC) and the first power terminal (VDD, VSS), and
an internal node connected to the junction between the leveling circuit main current path (MCP) and the further main current path of the further leveling transistor, and wherein the further leveling circuit is constructed for arranging, under control of the third voltage, the further leveling transistor
(i) as a forward-biased diode-connected transistor for regulating a voltage on the internal node, and thereby indirectly regulating a voltage on the first source for reducing a gate-source voltage of the first switching transistor (M1, M2) when the input voltage (Vin) assumes a level associated with the first logical level causing the first switching transistor (M1, M2) to be switched off, and
(ii) as a conductive path when the input voltage (Vin) assumes a level associated with the second logical level causing the first switching transistor (M1, M2) to be switched on.

13. The CMOS input circuit of claim 1, wherein the CMOS input stage (Inv1) is selected from a group comprising: an inverter, a buffer, and a logic gate.

14. An Input-Output circuit comprising the CMOS input circuit of claim 1.

15. An electronic circuit comprising the CMOS input circuit of claim 1.

16. A semiconductor device comprising the circuit of claim 1.

* * * * *